US008856694B2

(12) United States Patent
Ye et al.

(10) Patent No.: US 8,856,694 B2
(45) Date of Patent: Oct. 7, 2014

(54) COMPUTATIONAL PROCESS CONTROL

(75) Inventors: Jun Ye, Palo Alto, CA (US); Yu Cao, Saratoga, CA (US); James Patrick Koonmen, Santa Clara, CA (US)

(73) Assignee: ASML Netherlands B.V., Veldhoven (NL)

( * ) Notice: Subject to any disclaimer, the term of this patent is extended or adjusted under 35 U.S.C. 154(b) by 169 days.

(21) Appl. No.: 13/481,564

(22) Filed: May 25, 2012

(65) Prior Publication Data

US 2012/0303151 A1  Nov. 29, 2012

Related U.S. Application Data

(60) Provisional application No. 61/490,010, filed on May 25, 2011.

(51) Int. Cl.
*G06F 17/50* (2006.01)
*G05B 13/04* (2006.01)
*G03F 7/20* (2006.01)

(52) U.S. Cl.
CPC .......... *G03F 7/70525* (2013.01); *G05B 13/04* (2013.01)
USPC ............................................. 716/54; 716/55

(58) Field of Classification Search
CPC ... G01N 21/9501; G03F 7/70608; G03F 1/26; G03F 1/32; G03F 1/36; G03F 7/70616; G03F 7/70683; G03F 7/70525; G03F 7/706; G03F 7/70491; G06F 17/5045; G06F 17/5081; G01B 9/02084; G01B 9/02088; G01B 9/02072; G01B 11/2441; G01B 9/02011; G05B 2219/45031; G06T 2207/30148
USPC ...................................... 716/50–55
See application file for complete search history.

(56) References Cited

U.S. PATENT DOCUMENTS

| 7,301,603 | B2 | 11/2007 | Chen et al. | |
|---|---|---|---|---|
| 7,695,876 | B2 | 4/2010 | Ye et al. | |
| 2006/0234136 | A1* | 10/2006 | Kim | 430/5 |
| 2007/0174797 | A1* | 7/2007 | Luo et al. | 716/4 |
| 2010/0279213 | A1* | 11/2010 | Levy et al. | 430/30 |
| 2011/0116064 | A1 | 5/2011 | Ahn et al. | |

FOREIGN PATENT DOCUMENTS

| CN | 102043344 | 5/2011 |
|---|---|---|
| JP | 2001-035782 | 2/2001 |
| JP | 2002-231611 | 8/2002 |
| JP | 2002-353104 | 12/2002 |
| JP | 2003-532306 | 10/2003 |
| JP | 2006-228843 | 8/2006 |
| JP | 2006-279028 | 10/2006 |

* cited by examiner

*Primary Examiner* — Binh Tat
(74) *Attorney, Agent, or Firm* — Pillsbury Winthrop Shaw Pittman LLP

(57) ABSTRACT

The present invention provides a number of innovations in the area of computational process control (CPC). CPC offers unique diagnostic capability during chip manufacturing cycle by analyzing temporal drift of a lithography apparatus/ process, and provides a solution towards achieving performance stability of the lithography apparatus/process. Embodiments of the present invention enable optimized process windows and higher yields by keeping performance of a lithography apparatus and/or parameters of a lithography process substantially close to a pre-defined baseline condition. This is done by comparing the measured temporal drift to a baseline performance using a lithography process simulation model. Once in manufacturing, CPC optimizes a scanner for specific patterns or reticles by leveraging wafer metrology techniques and feedback loop, and monitors and controls, among other things, overlay and/or CD uniformity (CDU) performance over time to continuously maintain the system close to the baseline condition.

22 Claims, 7 Drawing Sheets

COMPUTATIONAL PROCESS CONTROL

CROSS-REFERENCE TO RELATED APPLICATIONS

This application claims priority to U.S. Provisional Application No. 61/490,010 filed May 25, 2011, which is incorporated herein by reference in its entirety.

FIELD OF INVENTION

The technical field of the present invention relates generally to lithography processes and apparatuses, and more specifically to performance stability control of lithography apparatuses and processes.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'-generally the smallest feature size printed—and $k_1$ is an empirical resolution factor. In general, the smaller $k_1$ the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example of RET, optical proximity correction (OPC), addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

While OPC has been integral to the computational lithography field, wafer metrology based process control has been used in the fab product field. To optimize overall development cycle times and manufacturing solutions, computational lithographers and fab product manufacturers have been working synergistically to optimize target designs, lithography processes and lithography apparatus parameters. Historically, chipmakers have optimized the various manufacturing steps independent of one another. However, migrating to 32-nm technology node and smaller, independent optimization is no longer enough. What is needed is a holistic lithography approach that intelligently integrates computational lithography, wafer metrology based lithography, and process control.

SUMMARY OF THE INVENTION

The present invention provides a number of innovations in the area of computational process control (CPC). CPC offers unique diagnostic capability during chip manufacturing cycle by analyzing temporal drift of a lithography apparatus/ process, and provides a solution towards achieving performance stability of the lithography apparatus/process. Embodiments of the present invention enable optimized process windows and higher yields by keeping performance of a lithography apparatus and/or parameters of a lithography process substantially close to a pre-defined baseline condition. This is done by comparing the measured temporal drift to a baseline performance model. Once in manufacturing, CPC optimizes a scanner for specific patterns or reticles by leveraging wafer metrology techniques and feedback loop, and monitors and controls, among other things, overlay and/or CD uniformity (CDU) performance over time to continuously maintain the system close to the baseline condition. CPC can be tailored to a specific customer requirement, specific technology node, and/or specific application.

An additional aspect of the present invention is to compensate for non-scanner effects, such as, resist process drift characterization.

Yet another aspect of the invention is to enable scanner matching using wafer metrology data collected from process signature patterns (PSPs).

These and other aspects of the present invention, including systems and computer program products corresponding to the above methods, will be apparent to a person skilled in the art in view of the following drawings and detailed description.

BRIEF DESCRIPTION OF THE DRAWINGS

The above and other aspects and features of the present invention will become apparent to those ordinarily skilled in the art upon review of the following description of specific embodiments of the invention in conjunction with the accompanying figures, wherein.

DETAILED DESCRIPTION OF THE EXAMPLE EMBODIMENTS

Figure 1:
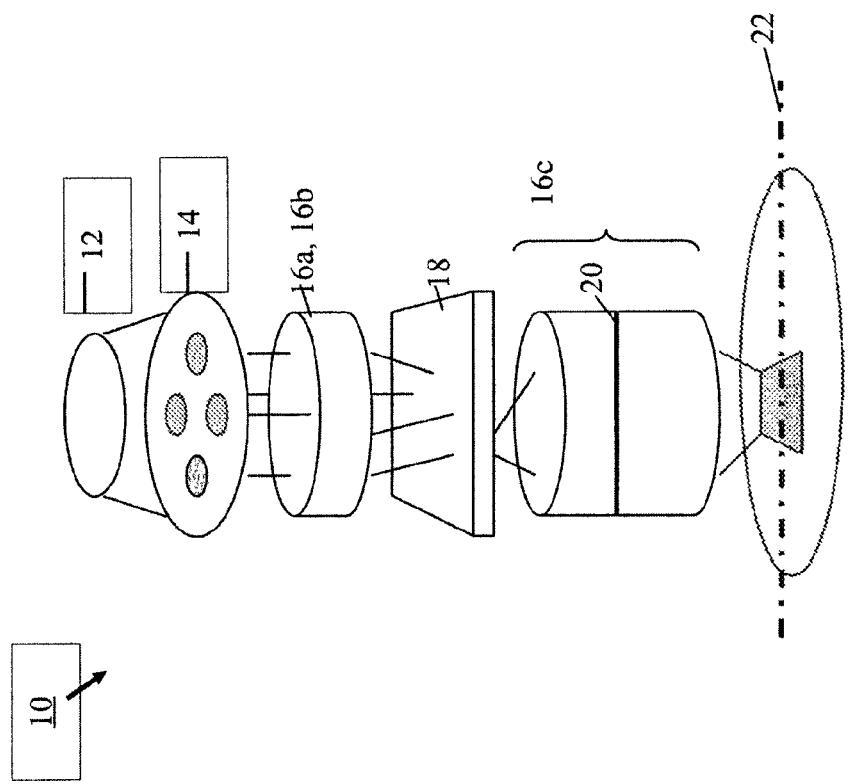
FIG. 1 is a block diagram of various subsystems of a lithography system according to example implementations of the present invention.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the semiconductor industry is driven by "shrink"—the ability to make chip features smaller, that often leads to increased device performance and decreased manufacturing cost. However, as chip features get smaller, so do the tolerances or "process window" that manufacturers must work within. The smaller the process window the harder it is to manufacture chips that work properly. Smaller process window typically imposes extremely tight requirements on parameters such as overlay and critical dimension uniformity (CDU).

To address the chip manufacturability need through lithography, an increased ability to control a lithography apparatus is imperative. Note that though there are different types of lithography apparatuses, including but not limited to a scanning lithography apparatus, the term 'scanner' has been used frequently in this application to denote any lithography apparatus that is used to perform a lithography process. Moreover, the lithography apparatus may not be a physical apparatus, but a simulated model of a physical apparatus.

Scanner stability control systems and methods give manufacturers greater control over their scanner's focus and overlay (i.e., layer-to-layer alignment) uniformity. This leads to an optimized and stabilized process window for a given feature size and chip application, enabling the continuation of shrink and the creation of more advanced chips. Note that the scanner stability control method works in conjunction with other controlling factors, such as, programmable illumination pupil control, projection optics (lens) control, etc.

When a lithography system is first installed/used, it is calibrated to ensure optimal operation. However, over time, system performance parameters will drift. A small amount of drift may be tolerated, but drift beyond a certain threshold may run the risk of the lithography process and/or apparatus going out of specification. So manufacturers may periodically need to stop production for re-calibration. Calibrating the system more frequently gives a bigger process window, but that usually means more scheduled downtime.

The scanner stability control options greatly reduce these production stoppages. Instead of stoppage, scanner stability control system automatically resets the lithography apparatus/process to a pre-defined reference performance (often referred to as 'baseline') periodically. The period of reset may be controlled by the users. Examples are, resetting every day, resetting after an arbitrary number hours of operation, resetting after a certain number of process runs, etc. To do the reset, the scanner stability control system retrieves standard measurements taken on a wafer using a metrology tool. The wafer may be a test wafer or monitor wafer. The monitor wafer is exposed using a special test reticle containing special scatterometry marks. However, persons skilled in the art will recognize that scatterometry marks can be accommodated in an actual target wafer also, such as along scribelines, in between two chips, in the peripheral areas of a wafer, etc. Additionally, wafer measurement technique is not limited to scatterometry. It may involve conventional measurements with scanning electron microscope (SEM). The scanner stability control method of the present application is not limited by the particular method of wafer metrology.

From wafer metrology, the scanner stability control system determines how far the system has drifted from its baseline. It then calculates, for example, wafer-level overlay and focus correction data. The lithography apparatus then converts these correction data sets into specific corrections for each exposure on subsequent wafers, including production wafers.

Some of the key features and benefits of the scanner stability control include, but are not limited to:

Long-term focus stability, at various process conditions, without sacrificing scanner productivity Long-term matched machine overlay stability, at various process conditions, without sacrificing scanner productivity Ability to monitor scanner overlay and focus Efficient integration into a fully automated/semi-automated step.

A. General Environment in a Lithography System for Implementing Example Embodiments of the Present Invention Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin ($\Theta_{max}$).

Figure 2:
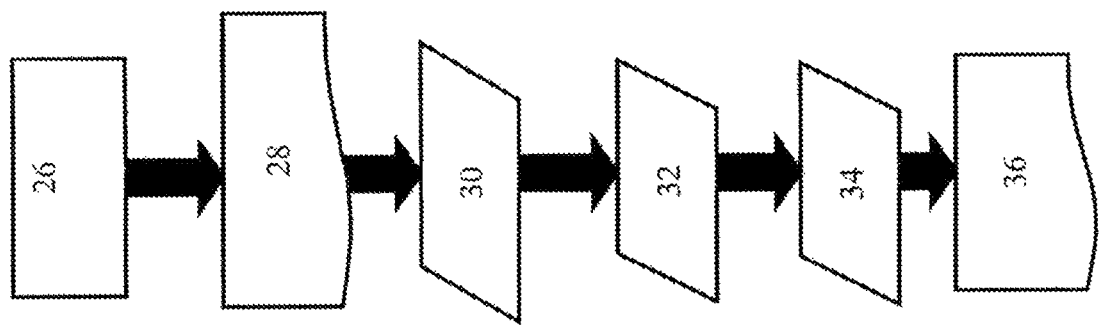
FIG. 2 is a block diagram of simulation models corresponding to the subsystems in FIG. 1.

In a lithography simulation system, these major system components can be described by separate functional modules, for example, as illustrated in FIG. 2. Referring to FIG. 2, the functional modules include the design layout module 26, which defines the target design layout; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape, where $\sigma$ (or sigma) is outer radial extent of the illuminator. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS. Those skilled in the art will understand that the input file format is irrelevant.

B. Example Methods of the Present Invention

Figure 3:
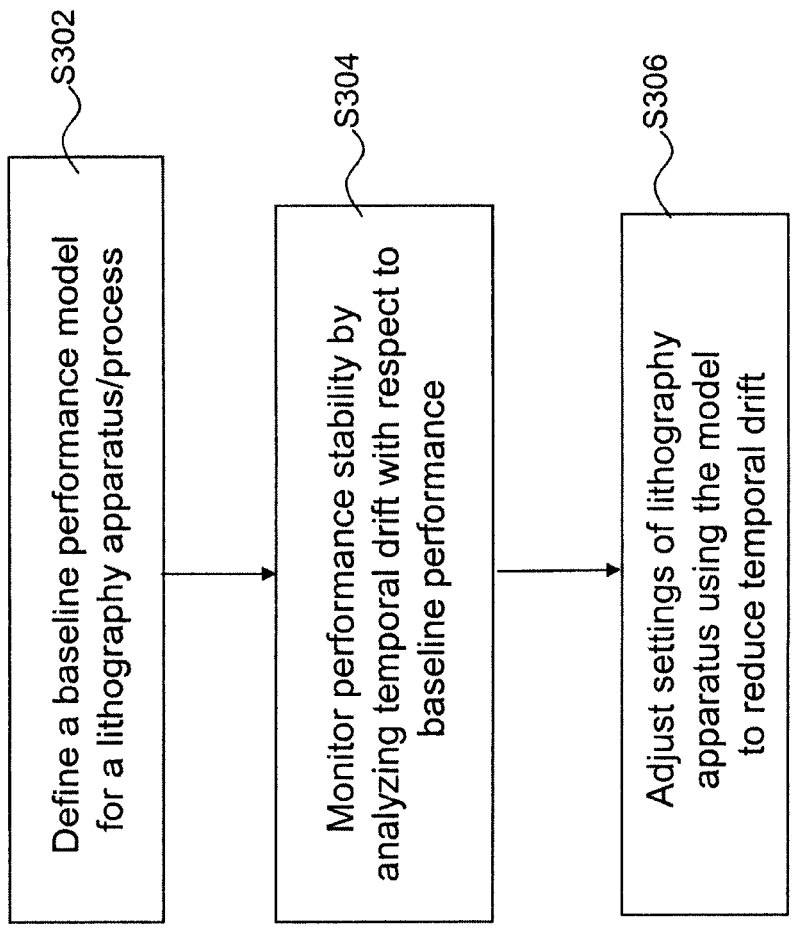
FIG. 3 is a flow diagram illustrating some key features of a lithography apparatus/process stability control method, according to an embodiment of the present invention.

FIG. 3 shows some key steps of an example lithography performance stability control method, according to the present invention. In step S302, a baseline performance model is defined for a lithography apparatus or lithography process. This model is developed based on experience or based on initial set-up/calibration. An example of initial setup of a lithography apparatus is discussed with respect to FIG. 4. The baseline performance model may also be referred to as a 'pilot model,' reference model,' baseline model,' or 'baseline reference model.'

In certain embodiments, the baseline performance model is used as a 'sensitivity model,' where the CD (or other metric) sensitivity of arbitrary test patterns to variations of one or more process parameters can be calculated from the model. This is further discussed with respect to FIG. 4.

In step S304, stability of the performance of the lithography apparatus or the lithography process is monitored. This is done by analyzing temporal drift of certain performance metrics over a certain predefined period and/or at a preset interval with respect to the baseline performance. In other words, the baseline performance serves as a guide to measure how much the performance has deviated with time. Further details of this step are discussed with respect to FIG. 5.

In one or both of steps S302 and S304, wafer metrology data may be used.

In step S306, one or more settings of the lithography apparatus are adjusted using the model defined in step 302, to compensate for the temporal drift, so that the performance is brought back substantially close to the desired baseline performance. Persons skilled in the art will understand that there may be parameters of a lithography apparatus or process (or a simulated model thereof) which can not be physically adjusted as a 'setting' (i.e. a condition that can be set by a tunable knob). 'Settings' of a lithography apparatus may be a subset of a bigger set of lithography parameters. In a physical scanner, some examples of controllable or tunable settings are: intensity distribution knobs of an illumination source (by programmable mirrors or other means), polarization control knobs of an illumination source, aberration control knobs in lens pupil plane or other planes along the projection optics system, numerical aperture control knobs, etc. Other examples of adjustable settings may include: wavelength spectrum of an illumination source, tilt of a reticle, tilt of a wafer, etc. Note that, the invention is not limited to compensating drifts of physical scanner-effects by adjusting the settings of an apparatus. Some example non-scanner effects, such as, resist process drifts, can also be compensated by tuning the settings of an apparatus. Example parameters relevant for resist process drift monitoring may: resist image parameters, resist diffusion, quencher concentration etc. For example, the resist diffusion effect causes a degradation in image contrast and dose latitude, and is largely degenerate with stage vibration. It is conceivable that certain optical settings can be adjusted to partially compensate for the image contrast loss, for example, NA, or stage vibration. Resist image parameters may include critical dimension uniformity (CDU), edge placement error (EPE), overlay error, side-wall angle (SWA), and best focus offset.

Figure 4:
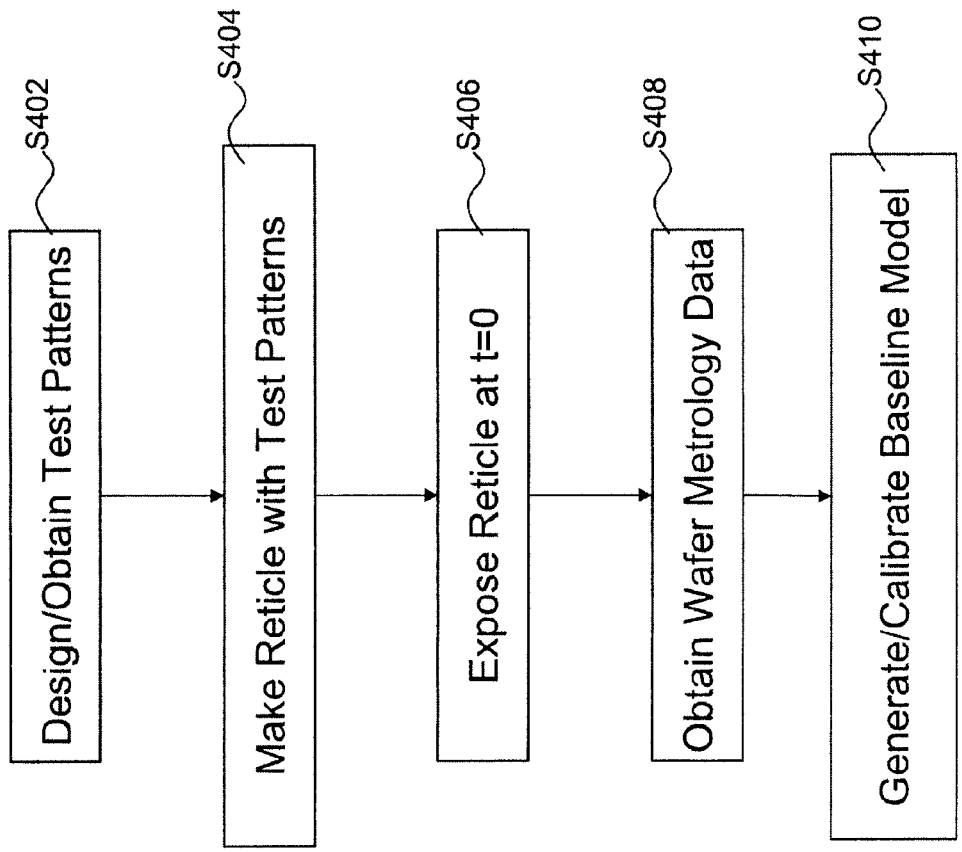
FIG. 4 shows an example of initial setup flow, according to an embodiment of the present invention.

FIG. 4 shows a flowchart for initial set-up for a lithography apparatus to generate and/or calibrate a baseline performance model.

In step S402, a set of test patterns may be designed and/or obtained from an existing pattern pool. Note that the test patterns may comprise dedicated test patterns which are not parts of the chip layout. Alternatively, parts of chip layout, i.e. some target patterns may be used as test patterns. In step S404, a reticle is created with the test patterns. The reticle may be a dedicated test reticle with dedicated test patterns, or the target reticle with target patterns and/or test patterns. A target reticle has a layout corresponding to the actual circuit to be reproduced on the wafer. A target reticle may also have test patterns. In a target reticle, test patterns may be accommodated along the scribelines, at the edges of the reticle, or interspersed with the target patterns in the reticle in any available unutilized real estate.

Typically, for process monitoring and control, a limited number of patterns are used. For example, 20-50 patterns may be used, but the illustrative examples are not limiting to the scope of the invention. The test patterns may be called 'process signature parameters (PSP)'. Limited number of PSPs is not enough to adequately represent variation of a large number of process parameters required to compensate for accurately measuring and compensating temporal drift of scanner performance.

By proper design of a large number of PSPs, and associating respective sets of PSPs to be optimally sensitive to a corresponding process parameter variation, a 'sensitivity model' or 'baseline model' may be created. In other words, The a plurality of PSPs are designed, wherein a first subset of the PSPs corresponds to the variation of a first lithography process parameter, and a second subset of the PSPs corresponds to the variation of a second lithography process parameter. The first subset and the second subset may comprise a single pattern. Optimally designed/selected PSPs can adequately expand the lithography process variation space to build an accurate baseline performance model. Further details of the PSPs can be found in co-owned U.S. Pat. No. 7,695,876, titled, "Method for identifying and using process window signature patterns for lithography process control," to Ye et al. PSPs can be laid out according to the metrology tool to be used, i.e. SEM-based metrology tool or scatterometry-based metrology tool.

In step S406, the reticle is exposed using predefined exposure conditions. This is considered an initial exposure for set-up/calibration purpose at time t=0.

In step S408, wafer metrology data is collected from metrology tool output. The metrology data may include, but are not limited to: CDU, edge placement error (EPE) (or overlay error), side-wall angle (SWA), best focus offset, etc. The metrology tool needs to be repeatable and robust.

In step S410, the baseline model is generated and/or calibrated using the wafer metrology data. The baseline model describes the relationship between scanner tunable parameters and the PSP's behavior under the particular metrology condition. Persons skilled in the art will understand that the baseline model can be derived from an existing reference lithography model with the assumption that the metrology tool's differential behavior can be predicted well by the existing reference lithography model. For run-to-run control, only differential behavior with respect to the reference model is important rather than the absolute behavior.

Figure 5:
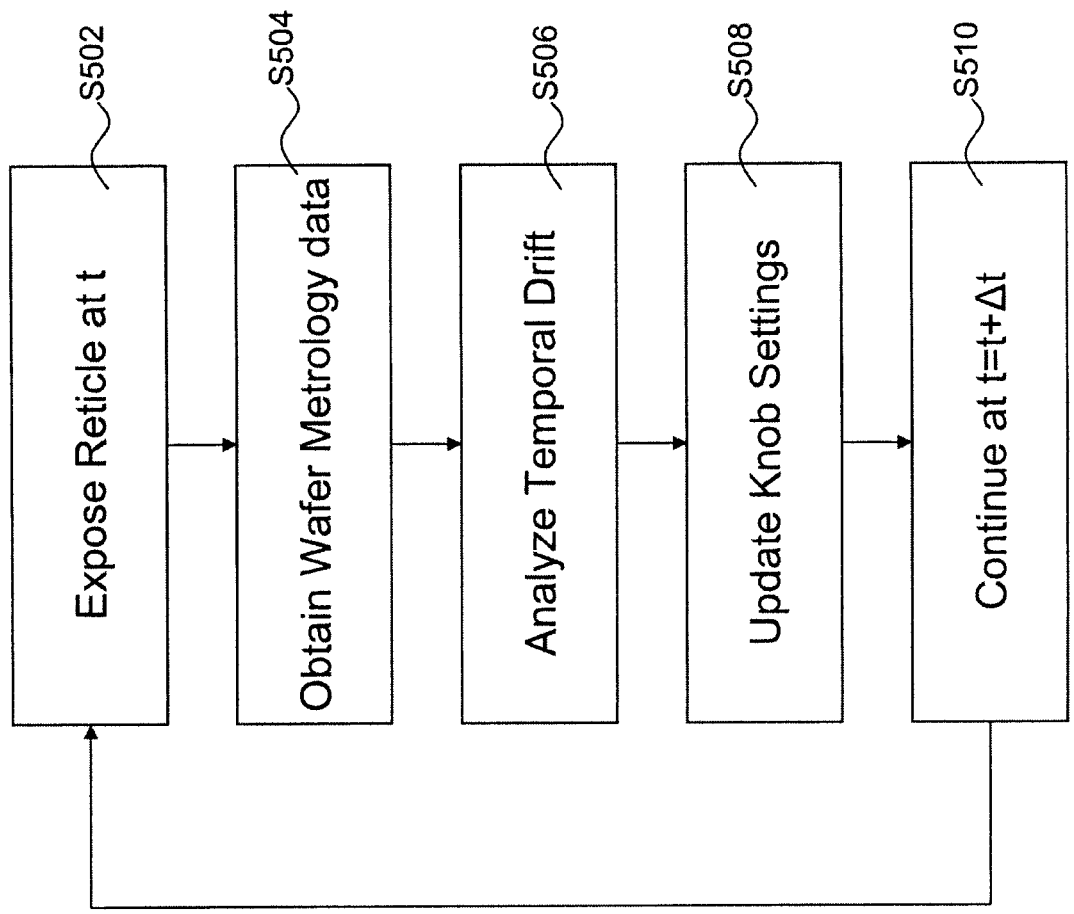
FIG. 5 shows an example of performance monitoring flow, according to an embodiment of the present invention.

Once the baseline performance model is defined, a monitoring stability control operation, as shown in the flowchart in FIG. 5, may be performed.

FIG. 5 starts with exposing the reticle (i.e. the reticle with PSPs) at a subsequent time 't' after the initial set-up. Wafer metrology data is collected again. The wafer metrology data at time t=0 and time 't' are compared to quantify temporal drift of the scanner performance (step S506). The time interval over which temporal drift is to be measured can be determined automatically based on scanner time overhead, metrology overhead, and computational overhead, historical data from previous temporal drift analysis, user preference, or a combination of these and other factors. By the term 'overhead,' it is meant the additional time required to accommodate a certain procedure that has some customized demands/end goals. For example, scanner time overhead is the additional time required to ensure that the temporal drift measurement steps discussed herein are accommodated. The time interval can also be predefined by the user, i.e. every day, every 'n' no. of process runs, every few hours etc.

In step S508, tunable knobs are adjusted, i.e., lithography apparatus settings are changed based on calculated corrective terms from the drift analysis. A feedback control loop may be used to adjust the settings. The input to the feedback control loop may comprise one or more of: difference between wafer metrology data at the initial time and the subsequent time (e.g., $\Delta CD$), sensitivity of PSPs on the reticle to lithography process parameter variation etc. For run-to-run control, to achieve a stable feedback loop control, some damping mechanism may be purposely introduced. For example, a computed optimum amount of correction to a tunable knob may not be applied immediately in one step, because that may lead to overcompensation and instability. Rather a part of the computed optimum amount of correction is applied in each step, allowing a multi-step tuning to eventually converge to the optimum. In that case, the baseline model only needs to correctly describe the general differential direction of compensation rather than having to predict the accurate differential behavior. The feedback control loop takes care of residual inaccuracy. This is akin to OPC convergence. The steps S502 to S510 can be repeated for every time interval $\Delta t$.

Note that by updating the tunable knob settings in step S508, temporal drift is compensated, so that the current drifted performance of the lithography apparatus is brought back to the desired baseline performance. In one embodiment, the tuning amount is calculated such that the lithography process is maintained at the center or close to the center of a process window.

The scope of the present invention can be extended to scanner matching, i.e. matching the current performance of a lithography apparatus to the performance of a reference scanner (or a simulated model thereof). PSPs and the baseline reference model can be used for application-independent scanner matching. If all reticles have the PSP structures on them, then using the wafer metrology data, scanner matching recipes can be generated, by which the performance of a particular scanner is matched or adapted to the performance of a reference scanner.

Additionally, a dose variation component (either intra-field or inter-field) may be extracted from the CD variation of the PSP targets, as long as the targets are laid out on the mask repetitively (intra-field), or exposed at multiple wafer positions (inter-field), and the wafer measurements are taken. Such variation can then be fed to a module that maps and/or adjusts spatial variation of radiation dose in order to compensate the spatial variation in CD (or other metric).

Persons skilled in the art will understand in view of the present disclosure that the lithography model may be used to determine a sensitivity of the lithography process with respect to a variation/adjustment of one or more settings of the lithography apparatus. This sensitivity correlation may be used to ensure that the adaptation of the one or more settings results in a stable lithography process and/or may be used in preventing an undesirable overshoot such that the lithography process after the adaptation of the one or more settings is again too far away from the baseline performance.

Moreover, in an embodiment of the invention, the lithography apparatus may have some knobs that may be varied within a predefined range, for example, without having to perform a full system calibration. By using the lithography model, settings of the knobs may be calculated to get the lithography process back within the predefined process window while preventing that these specific knobs need to be varied outside this predefined range. Due to this, the full system calibration may be extended and the down-time of such lithography apparatus may be reduced. In other words, a subset of the one or more settings of the lithography apparatus may have a predefined range within which the subset of the one or more settings is allowed to vary, and wherein the lithography model is used to determine the one or more settings of the lithography apparatus to maintain the lithography process at or substantially close to the defined baseline performance while maintaining the subset of the one or more settings within the predefined range, or, to maintain the lithography process within a predefined process window while maintaining the subset of the one or more settings within the predefined range.

It is to be noted that some knobs of the lithography apparatus may be fixed, either due to constraints in the lithography apparatus or due to constraints a user of the lithography apparatus enforces. In such a case, the lithography model may be used to find a different set of settings to still get the lithography model at least close to the base-line performance or within the predefined process window while using other knobs on the lithography apparatus.

As mentioned before, the step of adjusting one or more settings of the lithography apparatus using the lithography model may be performed iteratively, each iteration step comprising a relatively small adjustment of the one or more settings. This embodiment may be used to determine a kind of sensitivity of a specific knob by iteratively adjusting a setting of the knob by relatively small increments and see what the effect is on the lithography process. With the term relatively small increments or relatively small adjustments it is meant that the adjustments are substantially smaller than the full adjustment necessary to get the lithographic apparatus within or at least close to the base line performance or to get the lithographic apparatus within the predefined process window.

Persons skilled in the art will also understand in view of the present disclosure that the lithography model may be used to determine a degree (relative or absolute) of efficiency of the one or more settings of the lithography apparatus to maintain the lithography process at or substantially close to the defined baseline performance or to maintain the lithography process within a predefined process window. For example, this embodiment of the invention may be used to find which knobs on the lithography apparatus may be most efficient in reducing the current drift of the lithography process. As such, the most efficient knobs may be used to get the lithography process within the predefined process window.

The above illustrative embodiments may be modified within the scope of this invention for particular applications and/or depending on user preferences.

Figure 6:
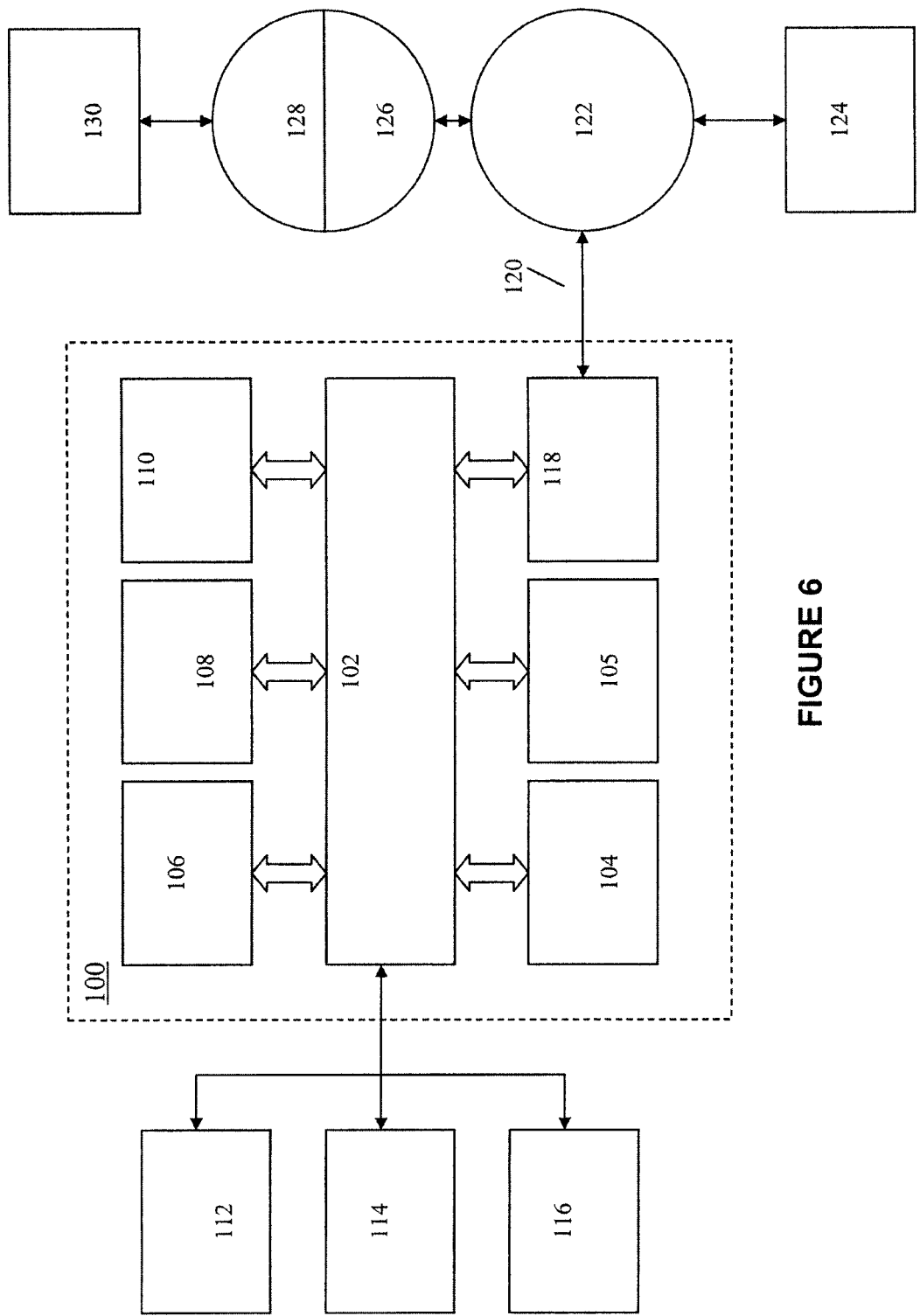
FIG. 6 is a block diagram of an example computer system in which embodiments of the invention can be implemented.

C. Details of a Computer System for Implementing the Embodiments of the Present Invention FIG. 6 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

D. Example Lithography Tool

Figure 7:
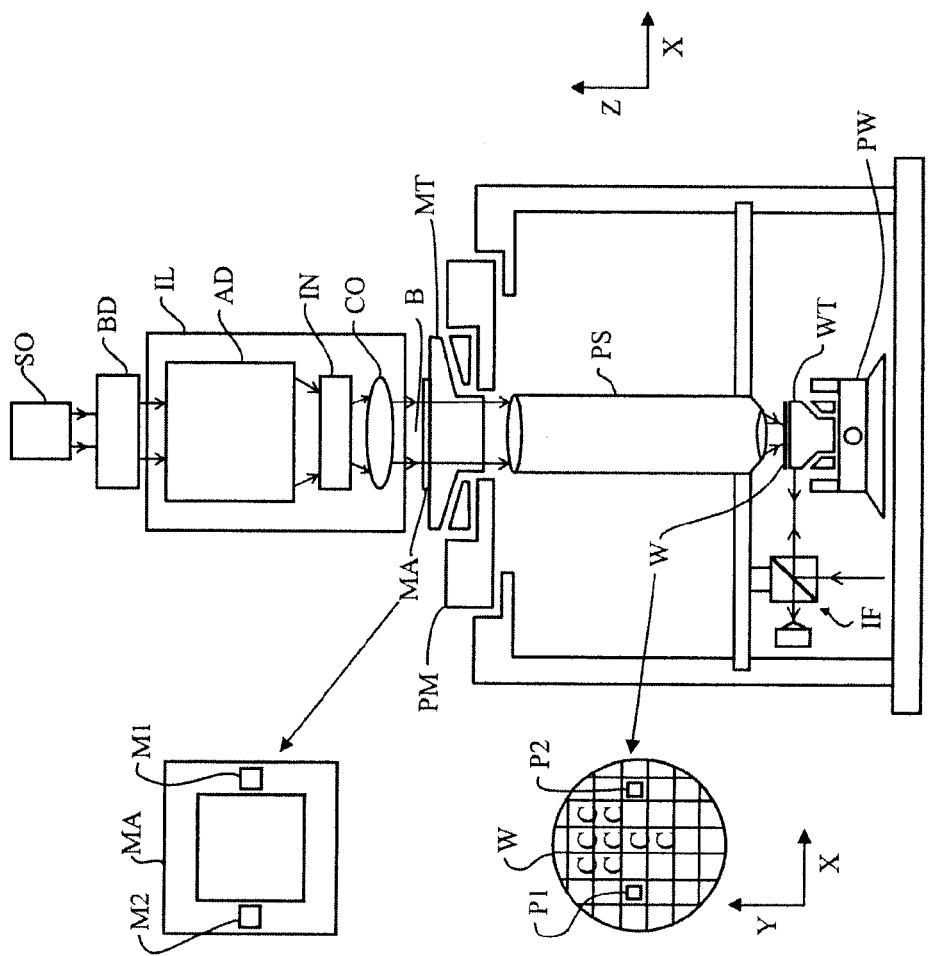
FIG. 7 is a schematic diagram of a lithographic projection apparatus to which embodiments of the invention are applicable.

FIG. 7 schematically depicts an exemplary lithographic projection apparatus whose performance could be simulated and/or optimized utilizing the computational lithography models that are calibrated using the test pattern selection process of present invention. The apparatus comprises:

- a radiation system Ex, IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist-coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 7 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method of controlling a lithography process by reducing a temporal drift of one or more parameters of the lithography process, the method comprising:
  (a) defining a baseline lithography process, where a model for the baseline lithography process is obtained using a first set of wafer metrology data collected from exposed patterns on a substrate using the lithography process at an initial time, and wherein the model is configured to simulate variations of one or more lithography process parameters;
  (b) monitoring a stability of the lithography process by analyzing the temporal drift of the parameters associated with a current lithography process, wherein the temporal drift is determined by comparing wafer metrology data obtained at the initial time, and subsequent wafer metrology data obtained from exposed patterns at a subsequent time; and
  (c) adjusting one or more settings of the lithography apparatus used to perform the lithography process to reduce the determined temporal drift by reducing the difference between the baseline lithography process and the current lithography process, thereby maintaining the lithography process within or substantially close to the defined baseline lithography process.

2. The method of clause 1, wherein the parameters of the lithography process include one or more of: resist image parameters, resist diffusion, quencher concentration.

3. A method of controlling a lithography process by reducing a temporal drift of a performance of a lithography apparatus used for the lithography process, the method comprising:
  (a) defining a baseline performance of the lithography apparatus, where a lithography model for the baseline performance is obtained using a first set of metrology data at an initial time, and wherein the lithography model is configured for simulating variations of one or more lithography process parameters in relation to one or more settings of the lithography apparatus;

(b) monitoring a performance stability of the lithography apparatus by analyzing the temporal drift associated with a current performance of the lithography apparatus with respect to the baseline performance, wherein the temporal drift is determined by comparing the metrology data collected at the initial time and subsequent metrology data collected at a subsequent time; and (c) adjusting the one or more settings of the lithography apparatus using the lithography model to reduce the determined temporal drift by reducing the difference between the baseline performance and the current performance.

4. The method of clause 3, wherein the step of obtaining the lithography model comprises one of: generating the lithography model using the first set of metrology data, and, calibrating an existing lithography model using the first set of metrology data.

5. The method of clause 3, wherein one or both of the metrology data at the initial time and the metrology data at the subsequent time comprise wafer metrology data collected from exposing patterns using the lithography apparatus and processing the exposed patterns using the lithography process.

6. The method of clause 3, wherein the lithography model is used to determine a sensitivity of the lithography process in response to an adjustment of the one or more settings of the lithography apparatus.

7. The method of clause 3, wherein the lithography model is used to determine which of the one or more settings of the lithography apparatus to adjust to maintain the lithography process at or substantially close to the defined baseline performance or to adjust to maintain the lithography process within a predefined process window.

8. The method of clause 3, wherein the lithography model is used to determine a minimum change in the one or more settings of the lithography apparatus to maintain the lithography process at or substantially close to the defined baseline performance, or, to maintain the lithography process within a predefined process window.

9. The method of clause 3, wherein a subset of the one or more settings of the lithography apparatus has a predefined range within which the subset of the one or more settings is allowed to vary, and wherein the lithography model is used to determine the one or more settings of the lithography apparatus to maintain the lithography process at or substantially close to the defined baseline performance while maintaining the subset of the one or more settings within the predefined range, or, to maintain the lithography process within a predefined process window while maintaining the subset of the one or more settings within the predefined range.

10. The method of clause 3, wherein a subset of the one or more settings of the lithography apparatus is fixed, and wherein the lithography model is used to determine which of the remaining one or more settings of the lithography apparatus to adjust to maintain the lithography process at or substantially close to the defined baseline performance or to maintain the lithography process within a predefined process window.

11. The method of clause 3, wherein the step of adjusting the one or more settings of the lithography apparatus using the lithography model is performed iteratively, each iteration step comprising a relatively small adjustment of the one or more settings.

12. The method of clause 3, wherein the lithography model is used to determine an efficiency of the one or more settings of the lithography apparatus to maintain the lithography process at or substantially close to the defined baseline performance or to maintain the lithography process within a predefined process window.

13. The method of clause 3, wherein in step (c), the lithography process is maintained within a predefined process window.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modification.

What is claimed is:

1. A computer-implemented method of controlling a lithography process by reducing a temporal drift of a performance of a lithography apparatus used for the lithography process, the method comprising:

(a) defining baseline performance of the lithography apparatus, where a lithography model for the baseline performance is obtained using a first set of wafer metrology data collected from exposed patterns using the lithography process at an initial time, and wherein the lithography model is configured to simulate variations of one or more lithography process parameters in relation to one or more settings of the lithography apparatus;

(b) monitoring a performance stability of the lithography apparatus by analyzing the temporal drift associated with a current performance of the lithography apparatus with respect to the baseline performance, wherein the temporal drift is determined by comparing the wafer metrology data collected at the initial time, and subsequent wafer metrology data collected from exposed patterns at a subsequent time; and (c) adjusting the one or more settings of the lithography apparatus to reduce the determined temporal drift by reducing the difference between the baseline performance and the current performance, thereby maintaining the lithography process within or substantially close to the defined baseline performance, wherein one or more steps of the method are performed by using a computer.

2. The method of claim 1, wherein steps (b) and (c) are repeated until the lithography process is brought within or substantially close to the baseline performance.

3. The method of claim 1, wherein in step (c), the lithography process is maintained within a predefined process window.

4. The method of claim 1, wherein prior to step (a), a plurality of patterns are designed, wherein a first subset of the plurality of patterns corresponds to the variation of a first lithography process parameter, and a second subset of the plurality of patterns corresponds to the variation of a second lithography process parameter.

5. The method of claim 1, wherein in step (c), a feedback control loop is used to adjust the one or more settings of the lithography apparatus, wherein inputs to the feedback control loop comprise one or more of: difference between wafer metrology data at the initial time and at the subsequent time; and, sensitivities of patterns on the reticle to variations of the one or more lithography process parameters.

6. The method of claim 1, wherein in step (b), a time interval of analyzing the temporal drift is determined based on one or more of: lithography apparatus time overhead, metrology overhead, computational overhead, previous temporal drift analysis, and user preference.

7. The method of claim 6, wherein the time interval is determined automatically.

8. The method of claim 1, wherein the wafer metrology data includes one or more of: critical dimension uniformity (CDU), edge placement error (EPE), overlay error, side-wall angle (SWA), and best focus offset.

9. The method of claim 1, wherein the patterns comprise test patterns on a test reticle, test patterns on a target reticle, or target patterns on a target reticle.

10. The method of claim 9, wherein test patterns on a target reticle are located on one or more of the following locations: scribe lines, one or more edges of a design layout, and unutilized real estate on the design layout adjacent to or interspersed with target patterns.

11. The method of claim 1, wherein the lithography model for the baseline performance is derived by matching with or adapting to an existing reference model.

12. The method of claim 1, wherein in step (c), the one or more settings of the lithography apparatus include: intensity distribution of an illumination source; polarization map of an illumination source; projection optics settings, wavelength spectrum of an illumination source, tilt of a reticle, and, tilt of a wafer.

13. A computer-implemented method of controlling a lithography process by reducing a temporal drift of one or more parameters of the lithography process, the method comprising:
  (a) defining a baseline lithography process, where a model for the baseline lithography process is obtained using a first set of wafer metrology data collected from exposed patterns on a substrate using the lithography process at an initial time, and wherein the model is configured to simulate variations of one or more lithography process parameters;
  (b) monitoring a stability of the lithography process by analyzing the temporal drift of the parameters associated with a current lithography process, wherein the temporal drift is determined by comparing wafer metrology data obtained at the initial time, and subsequent wafer metrology data obtained from exposed patterns at a subsequent time; and
  (c) adjusting one or more settings of the lithography apparatus used to perform the lithography process to reduce the determined temporal drift by reducing the difference between the baseline lithography process and the current lithography process, thereby maintaining the lithography process within or substantially close to the defined baseline lithography process,
  wherein one or more steps of the method are performed by using a computer.

14. The method of claim 13, wherein the parameters of the lithography process include one or more of: resist image parameters, resist diffusion, quencher concentration.

15. A computer-implemented method of controlling a lithography process by reducing a temporal drift of a performance of a lithography apparatus used for the lithography process, the method comprising:
  (a) defining a baseline performance of the lithography apparatus, where a lithography model for the baseline performance is obtained using a first set of metrology data at an initial time, and wherein the lithography model is configured for simulating variations of one or more lithography process parameters in relation to one or more settings of the lithography apparatus;
  (b) monitoring a performance stability of the lithography apparatus by analyzing the temporal drift associated with a current performance of the lithography apparatus with respect to the baseline performance, wherein the temporal drift is determined by comparing the metrology data collected at the initial time and subsequent metrology data collected at a subsequent time; and
  (c) adjusting the one or more settings of the lithography apparatus using the lithography model to reduce the determined temporal drift by reducing the difference between the baseline performance and the current performance,
  wherein one or more steps of the method are performed by using a computer.

16. The method of claim 15, wherein the step of obtaining the lithography model comprises one of: generating the lithography model using the first set of metrology data, and, calibrating an existing lithography model using the first set of metrology data.

17. The method of claim 15, wherein one or both of the metrology data at the initial time and the metrology data at the subsequent time comprise wafer metrology data collected from exposing patterns using the lithography apparatus and processing the exposed patterns using the lithography process.

18. The method of claim 15, wherein the lithography model is used to determine a sensitivity of the lithography process in response to an adjustment of the one or more settings of the lithography apparatus.

19. The method of claim 15, wherein the lithography model is used to determine which of the one or more settings of the lithography apparatus to adjust to maintain the lithography process at or substantially close to the defined baseline performance or to adjust to maintain the lithography process within a predefined process window.

20. The method of claim 15, wherein the lithography model is used to determine a minimum change in the one or more settings of the lithography apparatus to maintain the lithography process at or substantially close to the defined baseline performance, or, to maintain the lithography process within a predefined process window.

21. The method of claim 15, wherein a subset of the one or more settings of the lithography apparatus has a predefined range within which the subset of the one or more settings is allowed to vary, and wherein the lithography model is used to determine the one or more settings of the lithography apparatus to maintain the lithography process at or substantially close to the defined baseline performance while maintaining the subset of the one or more settings within the predefined range, or, to maintain the lithography process within a predefined process window while maintaining the subset of the one or more settings within the predefined range.

22. The method of claim 15, wherein a subset of the one or more settings of the lithography apparatus is fixed, and wherein the lithography model is used to determine which of the remaining one or more settings of the lithography apparatus to adjust to maintain the lithography process at or substantially close to the defined baseline performance or to maintain the lithography process within a predefined process window.

* * * * *